United States Patent [19]
Kitoh et al.

[11] Patent Number: 5,895,526
[45] Date of Patent: Apr. 20, 1999

[54] PROCESS FOR GROWING SINGLE CRYSTAL

[75] Inventors: Yasuo Kitoh, Okazaki; Masahiko Suzuki, Hoi-gun; Naohiro Sugiyama, Nagoya, all of Japan

[73] Assignee: Nippondenso Co., Ltd., Japan

[21] Appl. No.: 08/689,272

[22] Filed: Aug. 6, 1996

[30] Foreign Application Priority Data

Aug. 7, 1995 [JP] Japan ................... 7-200610

[51] Int. Cl.⁶ ........................................ C30B 29/36
[52] U.S. Cl. ................. 117/84; 117/88; 117/105; 117/951
[58] Field of Search ................. 117/84, 88, 105, 117/951; 437/100

[56] References Cited

U.S. PATENT DOCUMENTS

| | | | |
|---|---|---|---|
| Re. 34,861 | 2/1995 | Davis et al. | 438/933 |
| 5,433,167 | 7/1995 | Furukawa et al. | 117/84 |
| 5,441,011 | 8/1995 | Takahaski et al. | 117/84 |

FOREIGN PATENT DOCUMENTS

| | | |
|---|---|---|
| 63-2776 | 1/1988 | Japan. |
| 63-57400 | 11/1988 | Japan. |
| 3-1485 | 1/1991 | Japan. |
| 3295898 | 12/1991 | Japan. |
| 0165597 | 1/1992 | Japan. |
| 4055397 | 2/1992 | Japan. |
| 5-262599 | 10/1993 | Japan. |
| 5-319998 | 12/1993 | Japan. |
| 6-37353 | 5/1994 | Japan. |

*Primary Examiner*—Felisa Garrett
*Attorney, Agent, or Firm*—Cushman Darby & Cushman Intellectual Property Group of Pillsbury Madison & Sutro, LLP

[57] ABSTRACT

A process for growing a single crystal comprises providing a single crystal substrate acting as a seed crystal above a source material in a container, heating the source material in an inert gas atmosphere in the container to form a sublimed source material, and discharging the sublimed source material from the container through a port above the single crystal substrate, to cause the sublimed source material to flow along and in parallel with a surface of the single crystal substrate, and grow a single crystal on the surface of the single crystal substrate.

6 Claims, 3 Drawing Sheets

PROCESS FOR GROWING SINGLE CRYSTAL

BACKGROUND OF THE INVENTION

1. Field of the Invention

The present invention relates to a process and apparatus for growing a single crystal of, e.g. silicon carbide by the subliming recrystallization method, particularly a process and apparatus for growing an excellent single crystal with fewer defects.

2. Description of the Related Art

Conventionally, silicon carbide single crystal substrates are prepared as semiconductor substrates for high voltage high power semiconductor devices such as high voltage power transistors and high voltage diodes. The known methods for the manufacture of the silicon carbide single crystal substrates include the Acheson method, the Ley method and the subliming recrystallization method (Modified Lely method). The subliming recrystallization method is often adopted, for preparing semiconductor substrates, since it is advantageous for growing large area and high quality silicon carbide single crystals.

The subliming recrystallization method is disclosed in Japanese Examined Patent Publication (Kokoku) No. 63-57400.

Referring to FIG. 1, a silicon carbide powder 2 is charged in a closed carbide crucible 1 and heated and sublimed by an induction coil 8. A silicon carbide seed crystal 3, made of silicon carbide single crystal, is located in the crucible to face the silicon carbide powder 2. From the sublimed silicon carbide, silicon carbide 4 grows on the surface of a silicon carbide seed crystal 3 made of silicon carbide single crystal. The thus prepared silicon carbide single crystal 4 is supplied as a semiconductor substrate having a large area, controlled in its crystallinity and suitable for use in manufacturing a semiconductor device.

Optionally, liquid phase epitaxy (LPE) or vapor phase epitaxy (CVD) is further applied to the above silicon carbide single crystal substrate to form on the substrate a silicon carbide single crystal layer different in conductivity-type or carrier concentration from that of the substrate, which is also supplied as a substrate for manufacture of a semiconductor device.

However, a single crystal silicon carbide prepared by the above preparing method may have a number of linear defects, called micropipe defects, penetrating through the substrate. The micropipe defects involve electrical conductivity and therefore semiconductor devices manufactured using this semiconductor substrate with the micropipe defects may have defects such as leakage between source and drain or between gate and drain, which was confirmed by experiment To prevent the problems due to micropipe defects, Japanese Unexamined Patent Publication (Kokai) No. 5-262599 proposed use of a crystal plane perpendicular to (0001) plane as the surface of a silicon carbide single crystal substrate in the subliming recrystallization method.

However, since this method uses crystal growth in the direction perpendicular to (0001) plane, this method cannot be used for semiconductor substrates having (0001) plane as the surface thereof. For example, when the semiconductor device to be manufactured is a vertical-type MOSFET, a semiconductor substrate having a surface of (0001) plane is usually used and the above method cannot be used.

The object of the present invention is to provide a process and apparatus for growing a single crystal substrate of, e.g., silicon carbide, in a large scale while micropipe defects are prevented.

SUMMARY OF THE INVENTION

To attain the above object of the invention, the present invention provides a process for growing a single crystal, comprising placing a source material and a single crystal substrate including a seed crystal in an inert gas atmosphere, heating said source material to form a sublimed source material, and causing said sublimed source material to flow along and almost in parallel with a surface of said single crystal substrate including a seed crystal to grow a single crystal on the surface of said single crystal substrate.

In accordance with the present invention, a sublimed gas is made to flow along and almost in parallel with the surface of the single crystal substrate, which prevents defects from being formed by spiral dislocation in a growing single crystal on the substrate irrespective of the crystal orientation of the single crystal substrate.

There is also provided a process for growing a single crystal, comprising providing a source material in a container, placing a single crystal substrate acting as a seed crystal above said source material in said container, heating said source material in an inert gas atmosphere in the container to form a sublimed source material, and discharging said sublimed source material from said container through a port provided to said container above said single crystal substrate, to cause said sublimed source material to flow along and almost in parallel with a surface of said single crystal substrate to thereby grow a single crystal on the surface of said single crystal substrate.

Preferably, the single crystal substrate is a single crystal silicon carbide substrate with a surface of (0001) plane and said source material is silicon carbide.

In another aspect of the present invention, there is provided an apparatus for growing a single crystal by subliming a source material in an inert atmosphere, said apparatus comprising a container; a crucible located in said container for containing the source material, said crucible having an inner side surface; means for heating said source material to sublime said source material in said crucible; a cap mounted on said crucible and provided with a port facing said source material; a single crystal substrate detachably located on said inner side surface of said crucible; and means for discharging said sublimed source material from said crucible, wherein said single crystal substrate is located at a position on an axis connecting said source material and said port of said cap in such a way that said sublimed source material flows along and almost in parallel with a surface of said single crystal substrate when said sublimed source material is being discharged through said port of said cap.

DESCRIPTION OF THE PREFERRED EMBODIMENTS

Figure 2:
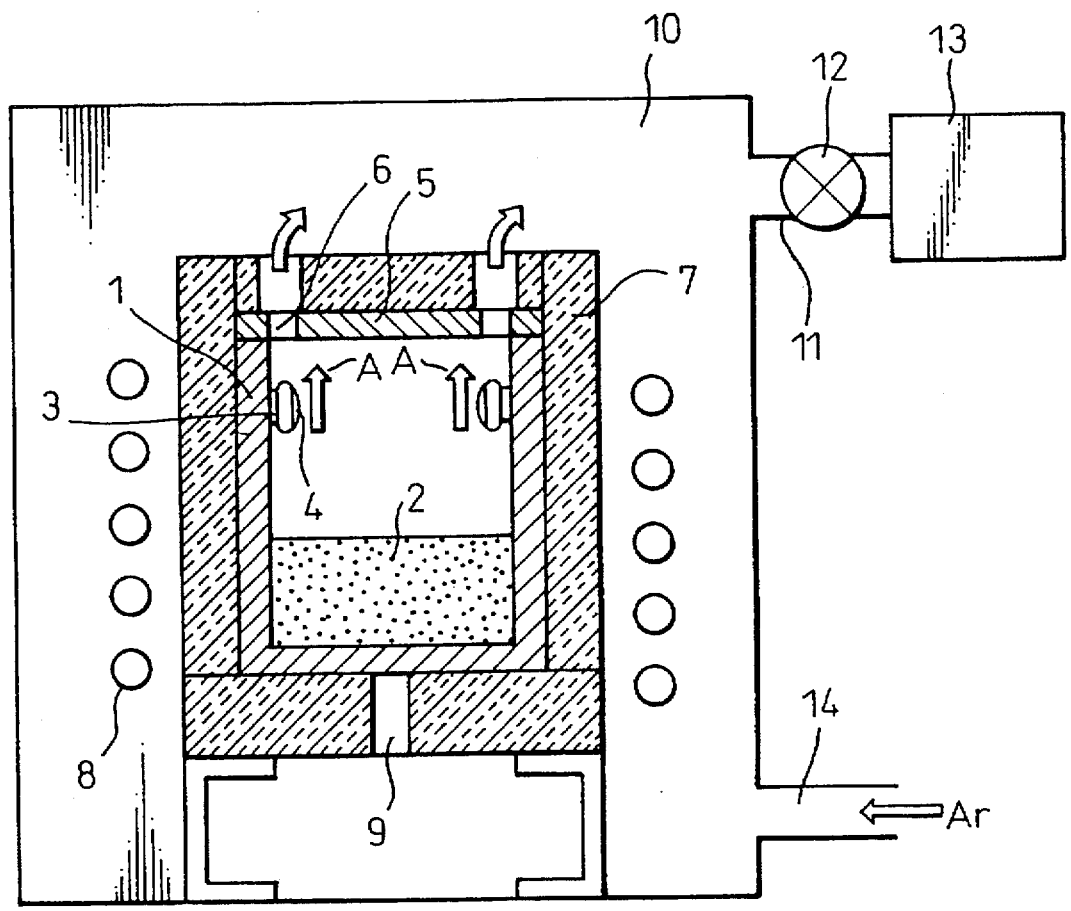
FIG. 2 is a cross-section of an apparatus for growing a silicon carbide single crystal according to a first embodiment of the present invention.
Figure 3:
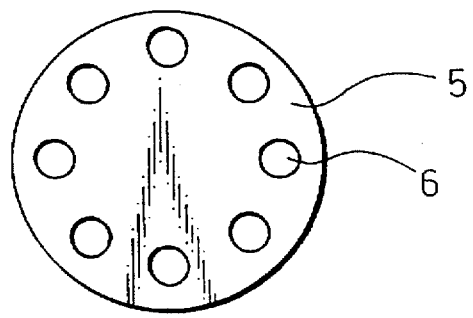
FIG. 3 is a plan view of a graphite cap of the crucible as shown in FIG. 2.

FIG. 2 shows a cross-section of an apparatus for growing a silicon carbide single crystal in a first embodiment.

This apparatus for growing a silicon carbide single crystal comprises a graphite crucible 1 in which a silicon carbide powder 2 is charged, a graphite cap 5 mounted on the graphite crucible 1 and having ports 6, silicon carbide single crystal substrates 3 acting as a seed crystals (in this case, each substrate consisting as a whole of a seed crystal) and detachably mounted on an inside wall of the graphite crucible 1, an induction coil 8 for heating the graphite crucible 1 and the graphite cap 5, to thereby heat the silicon carbide powder 2, a thermally insulting material 7 covering the graphite crucible 1 and the graphite cap 5 to insulate the graphite crucible 1 and the graphite cap 5, a hole 9 provided in the thermally insulating material 7 below the bottom of the graphite crucible 1 for measuring the temperature, a vacuum container 10 housing the all above members, an evacuating pipe 11 provided to the vacuum container 10, an evacuating valve 12 connected to the evacuating pipe 11 for adjusting the evacuating amount by changing the degree of opening of the valve 12, a vacuum pump 13 connected to the vacuum container 10 through the valve 12, and an inert gas introducing pipe 14 for introducing a certain inert gas, for example, argon gas, into the vacuum container 10. The amount of the inert gas introduced is controlled by a mass flow controller or the like (not shown).

As shown in FIG. 2, the graphite cap 5 has a plurality of ports 6 provided near the periphery of the cap 5 directly above the locations where the silicon carbide single crystal substrates 3 are mounted. These locations of the ports 6 are not limited to the vicinity of the periphery of the cap 5 as shown, as far as the sublimed gas is made to flow along the surface of the silicon carbide single crystal substrates 3.

In other words, the arrangement or the relationship between the location where each of the silicon carbide single crystal substrates 3 is mounted and the location of each of the ports 6 is selected in such a way that the sublimed gas flows almost in parallel with the surfaces of the silicon carbide single crystal substrates 3 when the sublimed gas is evacuated from the crucible 1 through the ports 6 by the vacuum pump 13 (flow A in the FIG. 2). The diameter of the ports 6 is preferably not less than 0.5 mm. If the diameter of the ports 6 is smaller than this, the sublimed gas may deposit on and close the ports.

The manufacture of a silicon carbide single crystal substrate by this apparatus for growing a silicon carbide single crystal is described below.

After 100 g of a silicon carbide source powder 2 was charged in the graphite crucible 1, a silicon carbide single crystal substrate 3 was mounted and a graphite cap 5 was placed on and secured to the top of the graphite crucible 1. In this embodiment, the silicon carbide source powder 2 was a silicon carbide powder with an average particle size of 500 μm, which was commercially obtained as an abrasive and was previously heat treated at 1800 to 2000° C. under vacuum. The silicon carbide single crystal substrate 3 as a seed crystal was a silicon carbide single crystal, was obtained while producing a silicon carbide grinding material by the Acheson method, was shaped and ground it and, just before starting the crystal growth, was cleaned with acid. The substrate 3 was then mounted on the graphite crucible 1. The basal plane of the substrate was (0001) plane.

The vacuum container 10 was then evacuated, by the vacuum pump 13 through the evacuating pipe 11 and the evacuating valve 12, to a vacuum of $1\times10^{-3}$ to $1\times10^{-4}$ Torr. Radio frequency power was supplied to the induction coil 8 to heat the graphite crucible 1. The temperature of the silicon carbide source powder 2 was assumed to be equal to that of the graphite crucible 1 which was measured at the bottom of the graphite crucible 1 through the hole 9 by an optical pyrometer.

When the temperature of the graphite crucible 1 or the silicon carbide source powder 2 was raised to 1200° C., argon gas was introduced into the graphite crucible through the inert gas introducing pipe 14 to a vacuum of $5\times10^2$ Torr. The temperature of the silicon carbide source powder 2 was again raised to 2300 to 2350° C. The temperature of the silicon carbide single crystal substrates 3 was set to be 50 to 150° C. lower than that of the silicon carbide source powder 2 as a result of relative arrangement of the graphite crucible 1 and the induction coil 8. After the temperatures of the silicon carbide source powder 2 and the silicon carbide single crystal substrate 3 were stabilized, the vacuum container 13 was evacuated by the vacuum pump 13. Along with this evacuation, sublimation of the silicon carbide source powder 2 started and a sublimed gas was formed and crystal growth began.

The vacuum in the graphite crucible 1 was increased to $5\times10^{-1}$ to $1\times10^{1}$ Torr, which was used as the pressure during the crystal growth. During the crystal growth, an argon gas flowed into the vacuum container 10 at a rate of 10 L/min with the degree of opening of the evacuating valve 12 being adjusted to control the vacuum degree.

Accordingly, the sublimed gas from the silicon carbide source powder 2 flowed along the surface of the silicon carbide single crystal substrates 3 (the direction A as shown in FIG. 2), to proceed the crystal growth, due to the difference in the temperatures of the sublimed gas and the silicon carbide single crystal substrates 3 and the withdrawal of the sublimed gas through the ports 6.

Although it depends on the desired thickness of the grown single crystal layer, after 5 hours of growth, for example, the vacuum chamber 10 was purged with an argon gas and the radio frequency power supplied to the induction coil was cut off to lower the temperature in the graphite crucible 1 and thus the growth finished.

In this growth, 63 grams of the silicon carbide source powder 2 was sublimed, 23 grams of which was discharged from the graphite crucible 1, and a silicon carbide single crystal ingot 4 with a thickness of 2 mm was obtained on the silicon carbide single crystal substrate 3.

The obtained crystal was sliced, polished and etched in fused KOH at 500° C. for 10 minutes, and etch pit observation was conducted but no hexagonal etch pit indicating a micropipe defect was found.

As shown above, in accordance with this embodiment of the present invention, a silicon carbide single crystal without micropipe defects can be grown on a silicon carbide single crystal substrate irrespective of the crystal plane of the silicon carbide substrate.

The reasons why a silicon carbide single crystal without micropipe defects can be grown on a silicon carbide single crystal substrate irrespective of the orientation of the crystal of the silicon carbide substrate are described below.

The reason why micropipe defects appear in a silicon carbide single crystal when grown on (0001) plane of the silicon carbide single crystal substrate as a seed crystal is that the surface of a silicon carbide single crystal substrate or a silicon carbide single crystal grown on a silicon carbide single crystal substrate has spiral dislocations and the direction of the displacement of the spiral dislocations is perpendicular to the (0001) plane and, as a result, steps appear on the surface of the grown single crystal due to spiral dislocations.

It is known that the crystal growth of silicon carbide by the sublimation recrystallization proceeds in the scheme of spiral growth and the above surface steps act as nucleation or growth ends. In this spiral growth, in order to release the stress energy of the spiral dislocations, vacancies are formed in the form of pipes along the dislocation axis. These vacancies are penetrated defects, i.e., micropipe defects.

Where a silicon carbide single crystal substrate having a surface of a plane perpendicular to (0001) plane is used as a seed, the direction of displacement of the spiral dislocation is parallel to the surface of the substrate and, therefore, surface steps due to the spiral dislocation do not appear. As a result, spiral growth does not take place and micropipe defects are not formed.

Figure 1:
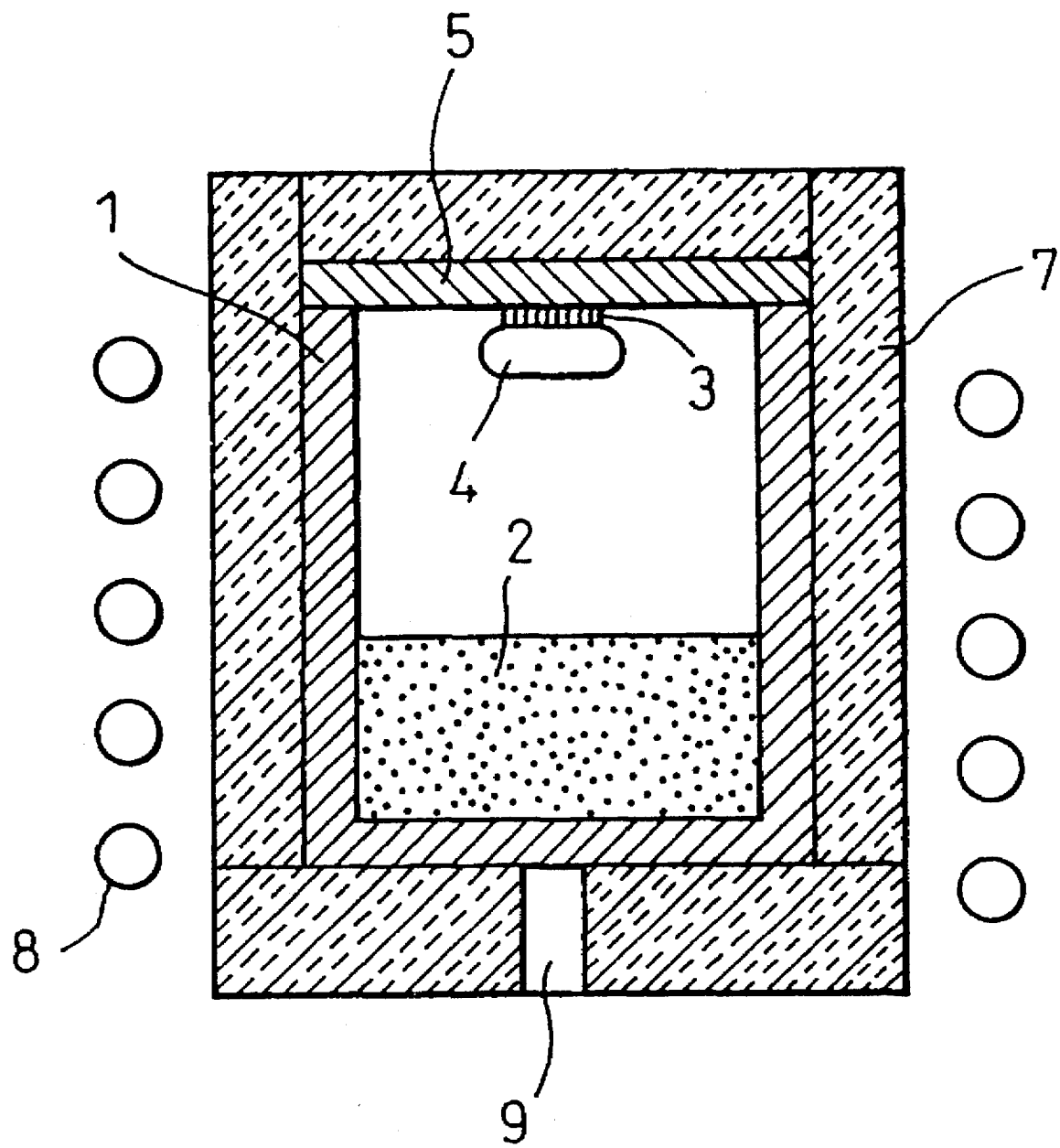
FIG. 1 is a cross-section of a conventional crucible for growing a silicon carbide single crystal.

In accordance with the process of the present invention, as shown in FIG. 2, a graphite crucible is provided with ports from which sublimed gas can be discharged to the exterior to the graphite crucible and silicon carbide single crystal substrates as seed crystals are arranged between, and almost on the line connecting, the source materials and the ports so that a sublimed gas flows along the surface of the silicon carbide single crystal substrates. In contrast, in the conventional method, as shown in FIG. 1, the crucible has a closed structure in which a flow of the sublimed gas from the source material to the silicon carbide single crystal substrates is caused only by a difference of the temperature therebetween and the flow is different from that of the sublimed gas in the present invention.

The spiral growth taking place where the silicon carbide single crystal substrate has a surface of (0001) plane is a phenomenon occurring in a crucible with a closed structure. It is not known whether or not the spiral growth occurs where the crucible has ports and the sublimed gas flows in the manner different from that in the conventional method.

In accordance with the present invention, it was discovered that even if the silicon carbide single crystal substrate has a surface of (0001) plane and surface steps formed by spiral dislocations, a silicon carbide single crystal grown on the substrate does not have micropipe defects.

It is therefore considered that by providing ports to a crucible, the flow of a sublimed gas is varied and the growth mode of silicon carbide is varied, which prevents formation of micropipe defects.

In the present invention, the silicon carbide single crystal substrates are located between and almost on lines connecting the source materials and the ports, so that the effect of the flow of the sublimed gas is significant on the silicon carbide single crystal substrates.

Further, the surfaces of the silicon carbide single crystal substrates are arranged almost in parallel with the lines connecting the source materials and the ports so that the direction of the flows of a sublimed gas and the direction of the surface of the silicon carbide single crystal substrates becomes almost parallel with each other, by which the variation of the growth mode is significant and the effect of preventing micropipe defects is superior in the above arrangement to the conventional method where the silicon carbide single crystal substrates are arranged to face the source material.

The ports of the crucible preferably have a size of not more than 0.5 mm. If the size of the ports is less than 0.5 mm, the sublimed gas deposits around the ports and the ports may be closed by the deposition.

Figure 4:
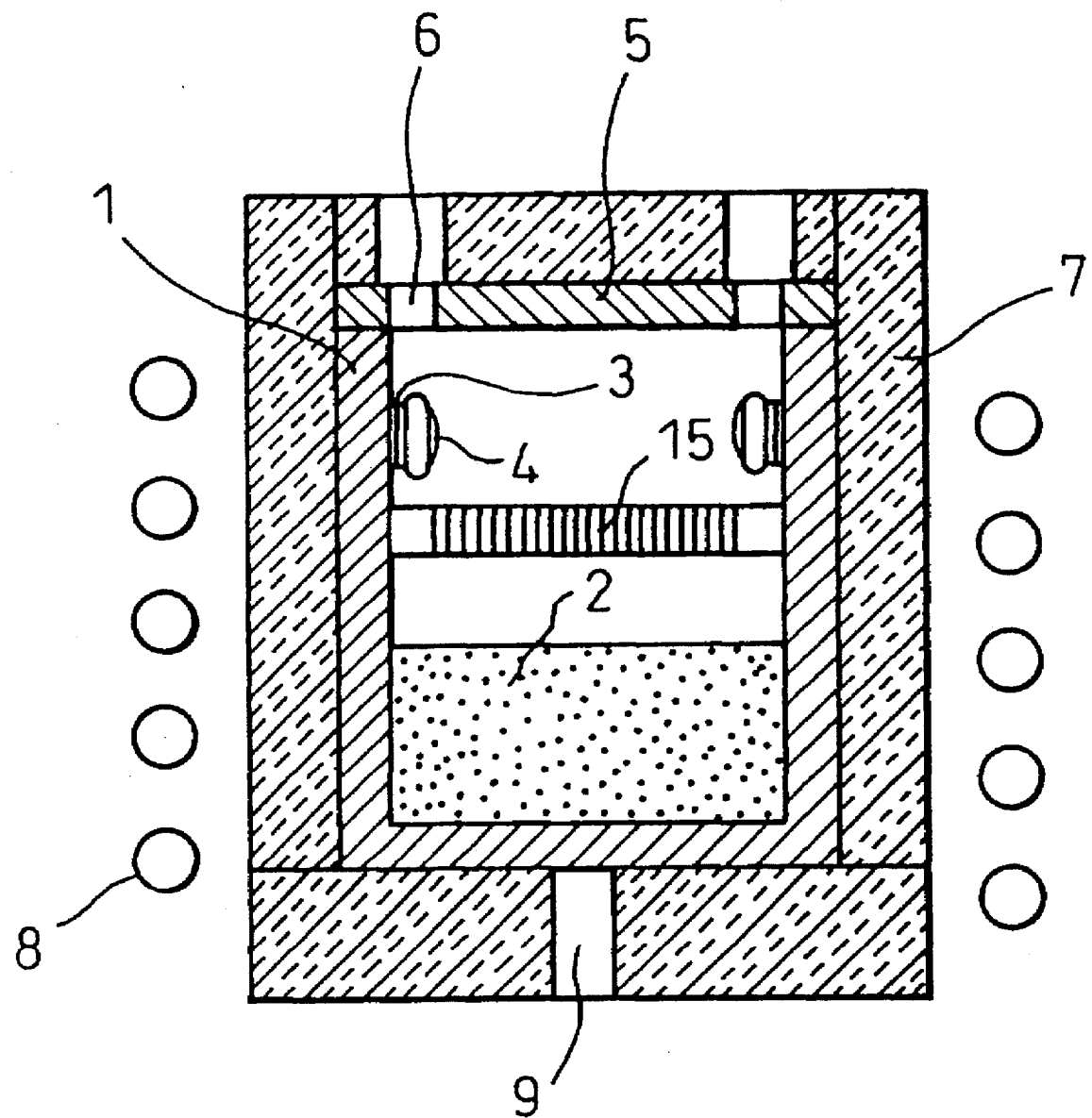
FIG. 4 is a cross-section of a crucible for growing a silicon carbide single crystal according to a second embodiment of the present invention.

FIG. 4 shows the structure of an apparatus for growing a silicon carbide single crystal in a second embodiment of the present invention. The apparatus for growing a silicon carbide single crystal as shown in FIG. 4 is a modification of and similar to the apparatus as shown in FIG. 2.

In this embodiment, as shown in FIG. 4, a sublimed gas flow-regulating plate 15 is arranged between the source silicon carbide powder 2 and the silicon carbide single crystal substrates 3 as a seen crystal in the graphite crucible 1. The sublimed gas flow-concentrating plate 15 is made of graphite having a plurality of pores in the vertical direction to concentrate the flow of the sublimed gas by the pores.

In this embodiment, a silicon carbide single crystal without micropipe defects was obtained.

The present invention is not limited to the above embodiments and can be modified without departing from the spirit of the invention stated in the claims.

For example, the number of the port provided to the cap of the crucible may be single or a plurality, but provision of a plurality of ports is preferred since the flow of the sublimed gas is more effectively regulated so as to be made closer to parallel with the surface of the seed crystal. The single crystal substrate containing a seed crystal may comprise a seed crystal on a single crystal substrate or may consist of only a seed crystal, as in the above embodiments.

The ports may not be provided in a cap for a crucible, and another constitution may be used as long as the sublimed gas is made to flow along and almost in parallel with the surface of the seed crystal.

The single crystal which can be grown in the method of the present invention may be silicon carbide and other materials which can grow a single crystal on a seed crystal by subliming a source material, for example, CdS, CdSe, ZnS, ZnSe, CdTe, etc.

We claim:

1. A process for growing a single crystal, comprising:
   placing a source material and a single crystal substrate in an inert gas atmosphere, said single crystal substrate including a seed crystal and having a surface on which a single crystal is to be grown;
   heating said source material to form a sublimed source material; and
   causing said sublimed source material to flow generally parallel along the surface of said single crystal substrate to thereby grow a single crystal on the surface of said single crystal substrate.

2. The process according to claim 1 further comprising:
   providing a container having a port and having said inert gas atmosphere therein, said source material and said single crystal substrate being placed in said container; and
   discharging said sublimed source material from said container through said port such that said sublimed source material flows generally parallel along said surface of said single crystal substrate.

3. The process according to claim 1 further comprising providing a container having said inert gas atmosphere therein, said source material and said single crystal being placed on a side wall of said container.

4. A process for growing a single crystal, comprising:
   providing a source material in a container having an inert gas atmosphere therein, said container having a port;
   placing a single crystal substrate acting as a seed crystal in said container between said port and said source material, said single crystal substrate having a surface on which a single crystal is to be grown;
   heating said source material to form a sublimed source material; and discharging said sublimed source material from said container through said port to cause said sublimed source material to flow generally parallel along the surface of said single crystal substrate, thereby growing a single crystal on the surface of said single crystal substrate.

5. The process according to claim 4, wherein said single crystal substrate is a single crystal silicon carbide substrate with a surface of (0001) plane and said source material is silicon carbide.

6. A process for growing a single crystal, comprising:

disposing a source material in a container having an inert gas atmosphere therein, said container having a port located generally opposite said source material;

placing a single crystal substrate acting as a seed crystal on a side wall of said container between said source material and said port, said single crystal substrate having a surface on which a single crystal is to be grown;

heating said source material to form a sublimed source material; and discharging said sublimed source material through said port to form a flow of said sublimed source material generally parallel along said surface of said single crystal substrate, thereby growing a single crystal on said surface of said single crystal substrate.

* * * * *